US006432736B1

(12) United States Patent
Lee et al.

(10) Patent No.: US 6,432,736 B1
(45) Date of Patent: Aug. 13, 2002

(54) ADJUSTABLE MONOLITHIC MULTI-WAVELENGTH LASER ARRAYS

(75) Inventors: San-Liang Lee; Ing-Fa Jang, both of Taipei (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/292,592

(22) Filed: Apr. 16, 1999

(30) Foreign Application Priority Data

Dec. 3, 1998 (TW) ....................................... 87120050 A

(51) Int. Cl.⁷ ........................... H01L 21/00; H01L 31/00
(52) U.S. Cl. .......................................... 438/34; 438/29
(58) Field of Search ............................. 438/22, 24, 28, 438/29, 27, 32, 34, 35; 372/50

(56) References Cited

U.S. PATENT DOCUMENTS 4,971,415 A * 11/1990 Hara et al. ..................... 372/97
5,553,091 A * 9/1996 Delorme ....................... 372/50
6,088,374 A * 7/2000 Sato ............................. 372/23

OTHER PUBLICATIONS

Young et al, IEEE Photonics Technology Letters, vol. 5, No. 8, "A 16×1 Wavelength Division . . . ", pp. 908–910, Aug. 1993.
Sarangan et al, IEEE Photonics Tech. Letters, vol. 8, No. 11, "Wavelength Control in DFB . . . ", pp. 1435–1437, Nov. 1996.
Lee et al, Journal of Lightwave Technology, vol. 14, No. 6, "Multiwavelength DFB Laser . . . ", pp. 967–974, Jun. 1996.
Sasaki et al, Journal of Crystal Growith 145, "Monolithically integrated multi–wavelength MQW–DBR . . . ", pp. 846–851, 1994.
Delorme et al, IEEE Photonics Technology Letters, vol. 8, No. 7, "Simple Multiwavelength Device . . . ", pp. 867–869, Jul. 1996.
Li et al, IEEE Photonics Technology Letters, vol. 8, No. 1, "16–Wavelength Gain–Coupled . . . ", pp. 22–24, Jan. 1996.
Tohmori et al, Electronics Letters, vol. 29, No. 4, "Over 100nm Wavelength Tuning In . . . ", pp. 352–354, Feb. 18, 1993.
Avrutsky et al, IEEE Journal of Quantum Electronics, vol. 34, No. 4, "Design of Widely Tunable . . . ", pp. 729–741, Apr. 1998.

(List continued on next page.)

Primary Examiner—Savitri Mulpuri
(74) Attorney, Agent, or Firm—Jacobson Holman, PLLC

(57) ABSTRACT

This invention demonstrates an adjustable monolithic multi-wavelength laser diode array formed on a substrate a plurality of diode lasers, each has an active section and two mirrors with similar multiple reflectivity peaks. A phase control section can also be included in each laser for fine tuning of the laser wavelength. Each laser in the laser array can emit light at the same wavelength or can be easily tuned to form an array with multiple wavelengths. To serve as an application example of this invention, sampled grating DBR lasers are designed to form a laser array with adjustable multi-wavelength outputs. By varying from laser to laser the sampling periods of the sampled gratings in each laser, a uniformly-spaced multi-wavelength laser array can be achieved with a simple tuning mechanism. The lasers can also emit light at the same wavelength or be tuned to other wavelengths by tuning the sampled grating mirrors. The technique for fabricating the laser array is similar to that for conventional DBR lasers and is already well established. The invented multi-wavelength laser arrays can find applications in WDM systems to offer the advantages of high performance, high reliability, compact size, and high speed.

4 Claims, 11 Drawing Sheets

OTHER PUBLICATIONS

Jayaraman et al, Indium Phosphide Conference, Paper No. MC2, "Continuous–Wave Operation . . . ", pp. 39–42, Mar. 1994.

Wang, IEEE Journal of Quantum Electronics, vol. QE10, No. 4, "Principles of Distributed . . . ", pp. 413–427, Apr. 1974.

Wang et al, IEEE Journal of Quantum Electronics, vol. QE17, No. 4, "Control of Mode Behavior . . . ", pp. 453–468, Apr. 1981.

Alferness et al, Appl. Phys. Lett. 60 (26), "Broadly tunable InGaAsP/InP laser based . . . ", pp. 3209–3211, Jun. 29, 1992.

Kogelnik et al, J. Appl. Phys., vol. 43, No. 5, "Coupled –Wave Theory of Distributed . . . ", pp. 2327–2335, May 1972.

* cited by examiner

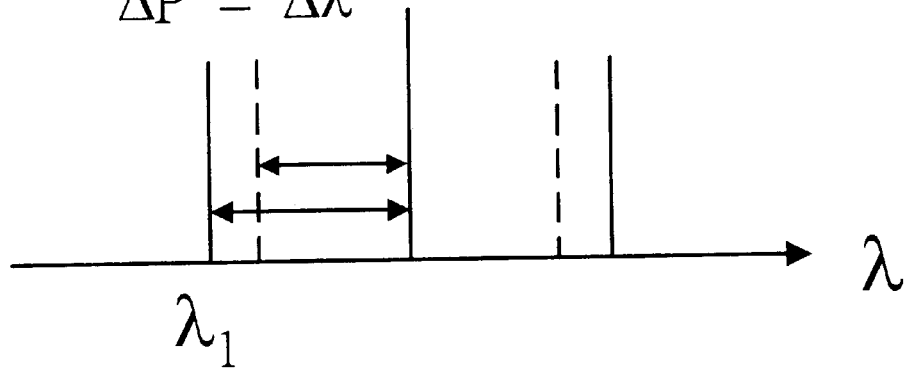
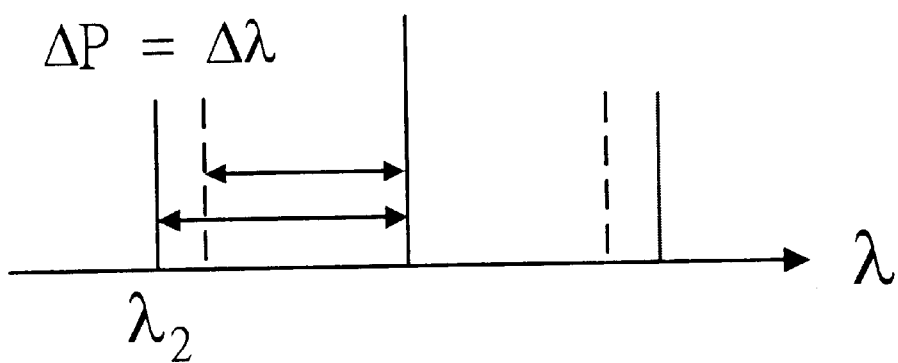
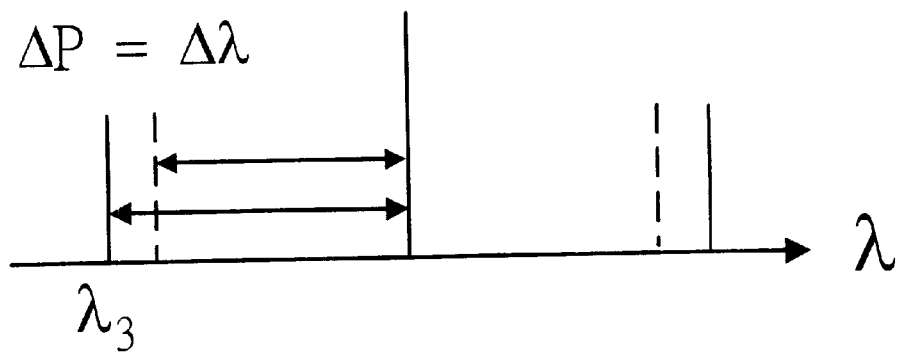
Figure 3

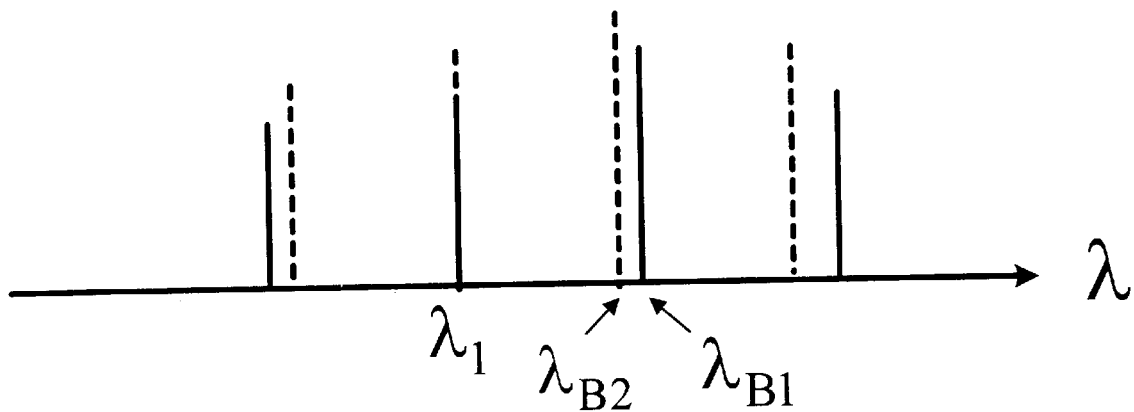
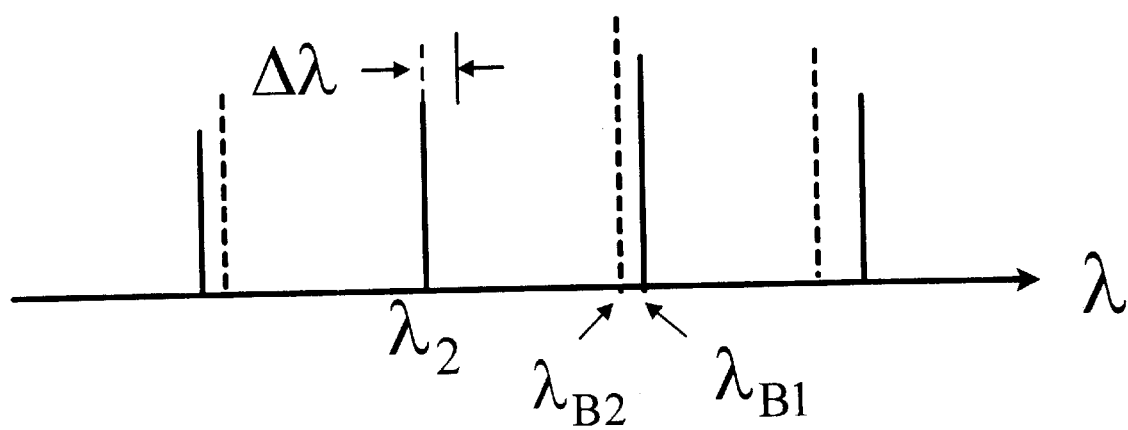
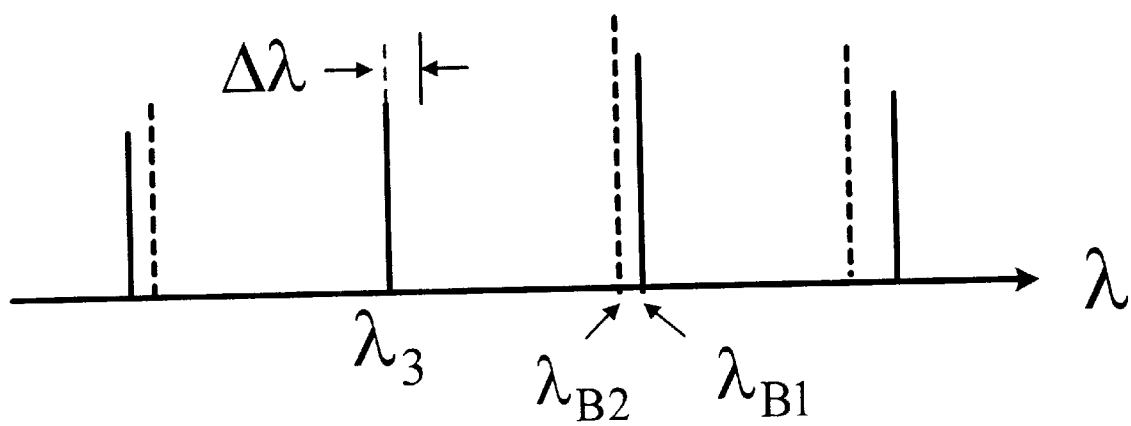
$$\lambda_{B1} - \lambda_{B2} = \Delta\lambda$$
Figure 4 m : channel spacing [nm/#]

Figurer 8

ADJUSTABLE MONOLITHIC MULTI-WAVELENGTH LASER ARRAYS

FIELD OF THE INVENTION

The present invention demonstrates an adjustable monolithic multi-wavelength laser diode array which are formed by a plurality of diode lasers on a substrate.

DESCRIPTION OF THE PRIOR ART

With the flourishing development of computer and the rapid growth of internet applications, people have higher demanding for data transmission and signal bandwidth. Since optical fiber has the advantages of wide bandwidth and low loss, it becomes the main medium of network transmission. Nowadays local area network has already been promoted from ethernet to high speed ethernet, and then to Gigabit ethernet. Televisions, networks, and cable televisions will associate together with the liberation of telecommunication. In order to provide these high speed and flexible services, optical networks using optical fiber as transmitting media becomes necessary. The fast increase in the demands for wide network bandwidth has stimulated the rapid growth of WDM fiber networks since WDM technology can greatly increase the bandwidth of the optical fiber networks. Multi-wavelength emitters are used in WDM networks to provide multi-wavelength optical signal. Usually they are formed of multi-wavelength laser array or combined from a plurality of tunable lasers. The key point of the wide-spreading usage of WDM lies in the performance and price of its components, including multi-wavelength light source, wavelength multiplexer/demultiplexer, optical filter, and multi-wavelength receivers, etc. The goal of the present invention is to combine the advantages of multi-wavelength laser array and tunable lasers to a simple method of fabricating high performance tunable laser arrays.

The required single frequency lasers (e.g. DFB laser) and tunable lasers (e.g. DBR laser)for high speed optical networks and long-distance communication have been mass produced. With the reduction of their cost, their applications are getting more widespread. Most of the multi-wavelength laser arrays and tunable lasers are made of DFB or DBR lasers currently. The fabrication procedures of the above laser arrays are usually very complicated and the wavelength spacing between lasers is difficult to control precisely, so they are not easy to commercialized. At present there are various technologies proposed for realizing tunable lasers for WDM systems. Among them, DBR, sampled grating DBR, and SSG etc. are more promising. Most of the embodiments of the present invention adopt the basic elements of the sampled grating DBR lasers of which the manufacturing technology is already very matured.

In response to the rapid growth of the volume of communication, WDM advances toward the direction of high density i.e., small channel spacing. To rule the devices and systems used in dense WDM networks, and to avoid the problem of wavelength mismatch between the light source and the interconnecting optical devices, ITU has established the standards of wavelength position and spacing in multi-wavelength (frequency) networks, therefore the wavelength preciseness of all optoelectronic devices used in dense WDM networks are getting more stringent. The multi-wavelength light sources in this type of networks must possess stable and accurate wavelengths. The wavelength spacing between channels in a laser array is difficult to control precisely and the yield is low with most of prior approaches for fabricating monolithic multi-wavelength laser arrays. If a plurality of independent tunable lasers are assembled to form a multi-wavelength light source, the cost is high and the size is large. The present invention is to resolve the above problems of multi-wavelength laser arrays for providing high performance and economic multi-wavelength emitters required in WDM network. Since the proposed tunable laser arrays have both of the advantages of multi-wavelength laser arrays and tunable lasers. The emitted wavelength of each laser can be adjusted and controlled by a simple method, therefore the wavelength and the wavelength spacing of a laser array can be set precisely.

The present invention combines both of the advantages of multi-wavelength laser arrays and tunable lasers to fabricate tunable multi-wavelength laser arrays and the detailed description of the present invention is as follows.

(1) prior technology: the prior technology related to the present invention can be classified into three categories 1. Multi-wavelength Laser Arrays Current multi-wavelength laser arrays are mainly composed of a plurality of DFB lasers or DBR lasers formed on the same chip, every laser in the array must have a different wavelength, usually neighboring lasers have the same wavelength spacing. The output beam of DFB lasers and DBR lasers is of single wavelength and have high sidemode suppression ratio, hence they are suitable for the elements of the multi-wavelength laser arrays; one advantage of DBR lasers is that their wavelength can be tuned. In general, the wavelength of each laser is determined by the Bragg wavelength of gratings in a laser array formed of DFB lasers or DBR lasers. Express Bragg wavelength by $\lambda_O$, then $\lambda_O$ can be written as: $\lambda_O = 2n_{eff}\Lambda$ where $n_{eff}$ is the effective refractive index of the waveguide; $\Lambda$ is the period of the grating. From the above equation, it can be seen that to vary the laser wavelength of the lasers in an array, the period of the grating or the effective refractive index of the waveguide has to be varied.

Hence there are several types of the approaches for fabricating multi-wavelength laser arrays in the prior technology as follows:

(1) Using multiple holographic exposure to vary the grating period of each laser, as shown by M. G. Young et al. in *IEEE Photonics Technology Letters*, Vol. 5, pp. 908–910 (1993).

(2) Making the angle between the waveguide of each laser and the grating different in order to vary the effective period of the grating, as shown by A. M. Sarangan et al. in *IEEE Photonics Technology Letters*, Vol. 8, pp. 1435–1437 (1996).

(3) Using e-beam lithography to directly write the grating of each laser so that they have different periods, as shown by T. P. Lee et al. in *Journal of Lightwave Technology*, Vol. 14, pp. 967–976 (1996).

(4) Using selective area growth technology to vary the effective index of every waveguide, as shown by T. Sasaki et al. in *Journal of Crystal Growth*, pp. 846–851 (1994).

(5) Using multiple etching technology to vary the thickness of every waveguide so that they have different effective index, as proposed by F. Delorme etal. In *IEEE Photonics Technology Letters* Vol. 8, pp. 867–869 (1996). p0 (6) Varying the width of every waveguide on the mask so that they have different effective index, as shown by G. P. Li, T. Makino et al. in *IEEE Photonics Technology Letters* Vol. 8, pp. 22–24 (1996).

The method (1) needs a special holographic exposure system, and it is very time-consuming. The performance of each laser by method (2) is not uniform, and the range of settable wavelength is limited. Fabricating the laser array by method (3) is very time consuming and not suitable for mass production. It is difficult to fabricate laser arrays which have uniform wavelength spacing and accurate wavelength by method (4), and the yield is also difficult to control. the laser array fabricated by (5) or (6) is prone to be affected by the process and it's difficult to control the wavelength, and the range of settable wavelength is also limited.

2. Tunable Laser

The following are the most often used tunable semiconductor lasers:

(1) DBR-S. Wang, "Principles of Distributed feedback and Distributed Bragg Lasers" IEEE Journal of Quantum Electronics, QE-10, pp.413–30 427, (1974)

(2) DFB-H. Kogelnik, C. V. Shank, APPl. Phys. Lett. 18, pp. 152 (1971).

(3) SGDBR-L. A. coldren, "MULTI-SECTION TUNABLE LASER WITH DIFFERING MULTI-ELEMENT MIRRORS" U.S. Pat. No. : 4,896,325, Date of issue at Jan. 23 (1990).

(4) GACC-R. C. Alferness et al., "Broadly tunable InGaAsP/InP laser based on a vertical coupler filter with 57-nm tuning range" Appl. Phys. Lett., vol. 60, no. 26, 29, pp.3209–3211 (1992).

(5) SSG-DBR-Y Tohmori et al., "Ultrawide wavelength tuning with single longitudinal mode by super structure grating (SSG) DBR lasers, " $13^{th}$ IEEE laser conf. '92, O-6 (1992).

(6) Y junction-S. Wang et al., IEEE Journal of Quantum Electronics, QE-17, pp.453 (1981).

The former two methods have smaller wavelength setting range (<15 nm), and the wavelength range of lasers fabricated by the other methods can be as long as several 10's nm or even more than 100 nm.

3. Semiconductor Laser Mirrors with a Plurality of Reflectivity Peaks (1) sampled grating: as proposed by V. Jayaraman et al. in Proceedings of the sixth International Conference on Indium Phosphide and Related Materials (IPRM '94), 1994.

(2) super structure grating: as proposed by Y. Tohmori et al. in *Electronics Letters*, Vol. 29, pp. 352–354 (1993).

(3) binary superposition grating: as proposed by I. A. Avrutsky et al. in *IEEE Journal of Quantum Electronics*, Vol. 34, pp. 729–741 (1998).

BRIEF DESCRIPTION OF THE INVENTION

Table I: The design parameters of the mirrors at both ends of the sampled grating laser array.

FIGS. 1(a)–(b)-: The schematic structure of each laser in the laser array

FIG. 1(a) 3-sectional structure FIG. 1(b)4-sectional structure.

FIGS. 2(a)–(b): The spectral reflectivity of both mirrors in each laser.

FIG. 3: The variation of the spectral reflectivity of the mirrors in an array, where the spectra of mirror 1 and mirror 2 are indicated by solid and dashed lines, respectively. The center positions of the spectral reflectivity of both mirrors of an individual laser are aligned at the same wavelength.

FIG. 4: The variation of the spectral reflectivity of the mirrors in an array, where the spectra of mirror 1 and mirror 2 are indicated by solid and dashed line, respectively. The center positions of the spectral reflectivity of both mirrors in an individual laser differs by $\Delta\lambda$.

FIG. 5: The schematic structure of a sampled grating laser.

FIG. 6: The structure of a sampled grating laser array.

FIG. 7: The output wavelength of a sampled grating laser array.

□ mode-3 ■ mode-2 ▼ mode-1 ◆ mode 0 ● mode 1 ▲ mode 2

Figure 1:

DESCRIPTION OF THE NUMBERS IN THE DRAWING 1-1, 2-1, 6-1, 8-1, 9-1 . . . mirror 1 1-2, 5-2, 6-2, 8-2, 9-2 . . . gain region 6-5 . . . laser 1 1-3, 2-2, 6-4, 8-4, 9-4 . . . mirror 2

1-4, 5-3, 6-3, 8-3, 9-3 . . . phase control region 6-8, 8-8, 9-8 . . . laser 21

5-1 . . . sampled grating 1 1-4 . . . sampled grating 2

6-6, 8-6, 9-6 . . . laser 2 6-7, 8-7, 9-7 . . . laser 3

SUMMARY OF THE INVENTION

The sampled grating is made by periodically removing portions of conventional DBR grating. The principle of super structure gratings is similar to that of the sampled gratings, but the grating pitch is varied in every period. It has been proven by experiments that these two types of grating can be used for high performance tunable lasers, the former can be made by holographic exposure in a single step, while the latter must be made by electron beam or phase mask exposure of which the process is more complicated. Binary superposition is a newly announced technology which has not been verified by experiment.

The present invention is to provide novel approaches for realizing high performance multi-wavelength laser arrays required by WDM networks, and to overcome the difficulty of controlling the wavelength spacing and accuracy in this type of laser arrays. The method of the present invention can greatly simplify the process and raise the yield of laser arrays, since it possesses both of the advantages of multi-wavelength laser arrays and tunable lasers. The wavelength of each laser can be fine adjusted, so the wavelength spacing between neighboring lasers and the wavelength position of each laser can be precisely set in a simple way. The devices made by this new method can reduce the price of multi-wavelength emitters, enhance its reliability, and speed up the development of dense WDM networks in future high speed information highway.

Figure 1B:
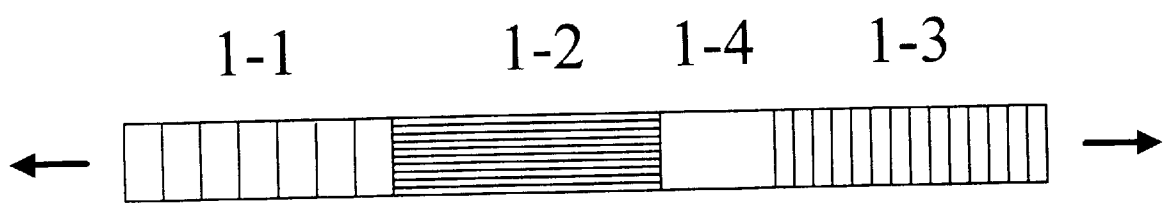
Figure 2:
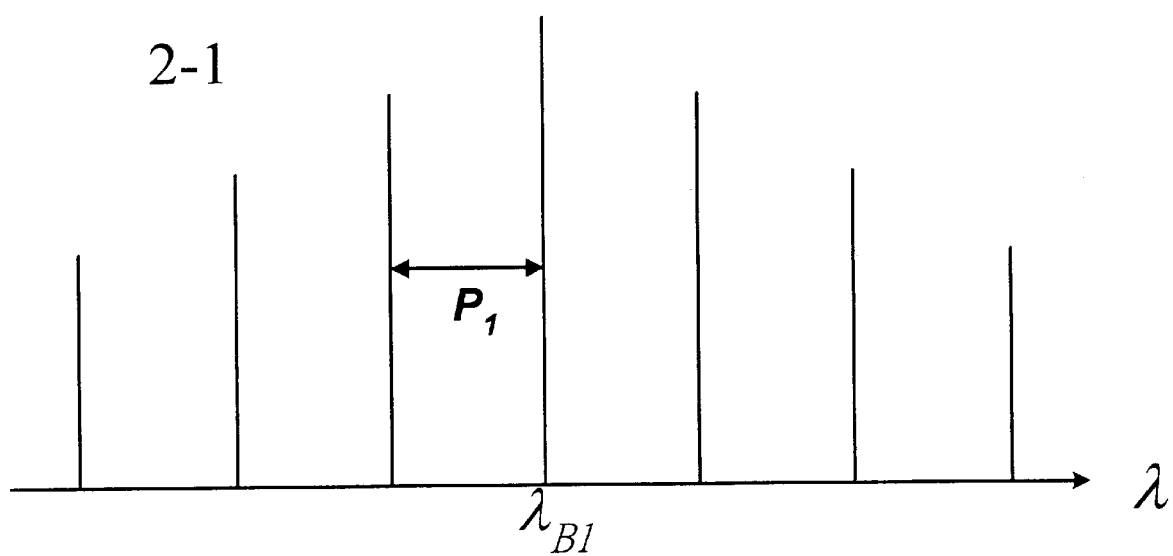
Figure 2:
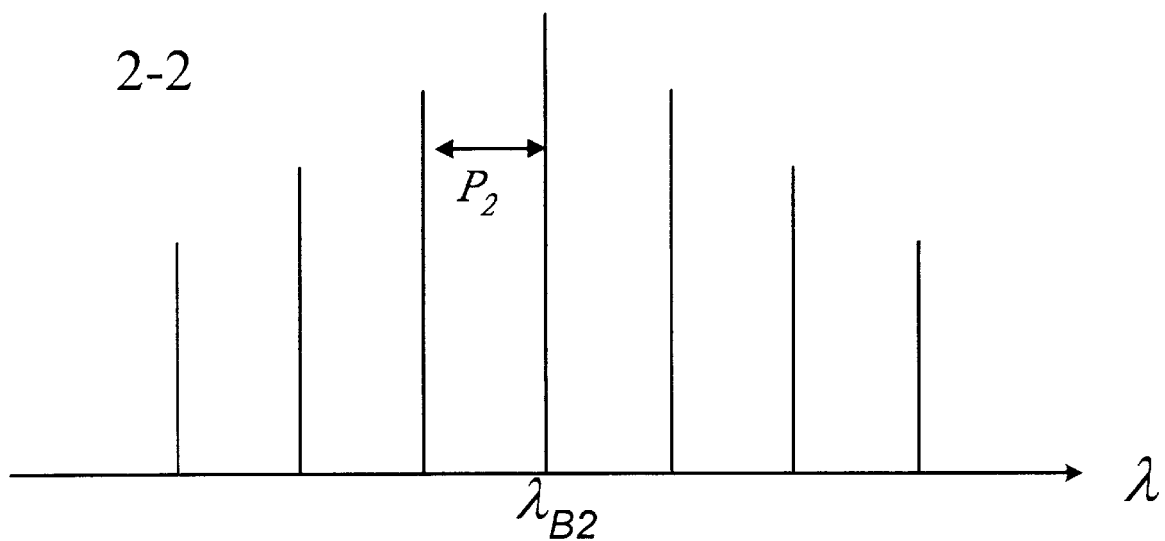

The proposed method of the present invention for fabricating multi-wavelength laser arrays and tunable lasers uses the structure of FIG. 1 as the longitudinal structure of each laser in the laser array. Every laser contains at least 3 sections: one gain section to provide sufficient stimulated emission, and two mirrors with multiple reflection peaks on the spectrum, as shown in FIG. 1(a). In addition, to fine tune the emitted wavelength of laser, one phase control section can be added into the longitudinal structure of each laser, as shown in FIG. 1(b). The reflectivity of the mirrors on both ends of an individual laser have multiple peaks on their reflection spectra. As shown in FIG. 2, the position of wavelength where the reflection peaks of mirror 1 and mirror 2 located can be written as $$\lambda_m = \lambda_{B1} + mP_1, \, m = 0, \pm 1, \pm 2, \ldots \text{ mirror } 1 \quad (1)$$

$$\lambda_n = \lambda_{B2} + nP_2, n = 0, \pm 1, \pm 2, \ldots \text{ mirror } 2 \quad (2)$$

This kind of reflection spectra can be accomplished by the methods of sampled grating, super-structure grating, or other methods. In Equations (1) and (2), $\lambda_B$ represents the Bragg wavelength of grating, and $P_1$ and $P_2$ represent the wavelength spacing between two neighboring reflection peaks. $\lambda_{B1}$ and $\lambda_{B2}$ can be the same in practical laser fabrication (e.g. in one holographic exposure), and may also be different (e.g. made by two holographic exposures or by varying the effective index of the two mirrors).

DESCRIPTION OF THE PREFERRED EMBODIMENTS

Based on the reflection spectra of the two mirrors, there are two ways to design a laser array:

(1) Align the center position of the reflection spectra of the two mirrors, i.e.; $\lambda_{B1}=\lambda_{B2}$; and the values of $P_1$ and $P_2$ vary from laser to laser. FIG. 3 shows the mirror reflection spectra of a laser array with a uniform wavelength spacing. If $\Delta\lambda$ represents the wavelength spacing between neighboring lasers, $\Delta P$ is the absolute value of $P_1-P_2$, then the difference in $P_1$ between neighboring lasers is $\Delta\lambda$, so is the difference in $P_2$ between neighboring lasers. In the situation when the mirror is not tuned, since the center position of the reflection spectra of the two mirrors are aligned, the laser will emit at this wavelength. Therefore, the output wavelengths of all lasers in a laser array will be the same. When the reflection spectra of one of the mirror is tuned by l$\Delta P$ (l is an integer), the reflection spectra are aligned at the lth peak, hence the laser will emit at this corresponding wavelength. Also, since the difference in $P_1$ and $P_2$ of neighboring lasers is $\Delta\lambda$, the emitted wavelengths of neighboring lasers will differ by l$\Delta\lambda$ with the same amount of tuning. Therefore with the same (and minor) tuning, a multi-wavelength laser array with a uniform wavelength spacing can be formed.

(2) Two of the reflection peaks among the two mirror reflection spectra are aligned, i.e. $\lambda_m=\lambda_n$; but $P_1$ and $P_2$ still vary from laser to laser in an array. FIG. 4 is the schematic of mirror reflection spectra for this type of laser arrays with a uniform wavelength spacing. The Bragg wavelength of the two mirrors in an individual laser are different, but $\Delta P$ is the same for all lasers. The difference in $P_1$ between neighboring lasers is $\Delta\lambda$, so is the difference in $P_2$ between neighboring lasers. In the situation when the mirror is not tuned, since the reflection spectra of the two mirrors are aligned at $\lambda_m$, the laser will emit at this wavelength. The difference in $\lambda_m$ for two adjacent lasers is m $\Delta\lambda$. Therefore the output wavelength of each laser in the laser array will differ by m $\Delta\lambda$. A multi-wavelength laser array with uniform wavelength spacing can thus be formed without tuning the mirrors. If one of the mirror is tuned, the laser will emit at the other aligned reflection peaks. Provided that every laser has the same amount of tuning into the mirrors, a multi-wavelength laser array with another wavelength spacing will be formed.

To align the reflection spectra of the two mirrors at $\lambda_m$ rather than the Bragg wavelength, the waveguide structures of the two mirrors must have offset to result in different effective indexes. This can be achieved by etching the waveguides into different width or thickness or by two holographic exposures. So that the Bragg wavelengths of both mirrors will have relative tuning, such that the reflectivity peaks of two mirrors are aligned at $\lambda_m$.

Embodiment: SGDBR Laser Array

Figure 5:
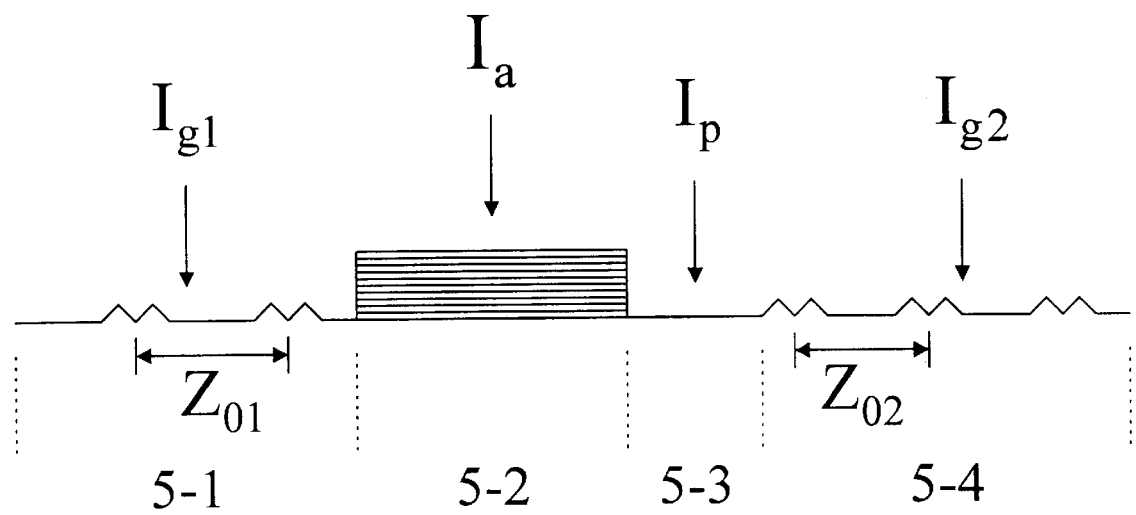

Since one of the main goals of the present invention is to simplify the fabrication procedures process of multi-wavelength laser arrays, among the approaches that can provide a plurality of reflectivity peaks, the sampled grating is chosen to be the mirror of each laser in a laser array. This is due to the fact that sampled gratings can be fabricated with single holographic exposure and the fabrication technology is quite matured. The schematic structure of a SGDBR laser is shown in FIG. 5. The reflection spectra of both mirrors have the characteristics shown in FIG. 2. The product of the reflection peak spacing of each sampled grating mirror (P) and its period ($Z_0$) is a constant, and the relation between both quantities can be written as (3):

$$P*Z_0 = \frac{\lambda^2}{2n_g} \quad (3)$$

where $n_g$ is the group index, $\lambda$ is the wavelength in vacuum. By varying the period of sampled grating, one can obtain the corresponding change in the peak spacing of the reflection spectrum. Each laser in a laser array has two mirrors of which the reflection spectra have different peak spacings, $P_1$ and $P_2$. If the Bragg wavelengths of the gratings at both sides of a laser are the same (e.g. made by one holographic exposure), the reflection spectra of the two mirrors are overlapped at the Bragg wavelength in the situation when no tuning currents inject into the mirrors, and the laser will emit at this wavelength. If we inject current into the sampled grating with larger period (e.g. sampled grating 2 as shown in FIG. 5), the corresponding reflection spectrum will shift toward the direction of shorter wavelength. When it shifts by $\Delta P=P_1-P_2$, the reflection spectra of both mirrors will be aligned at $\lambda_B-P_1$, and laser will emit at this wavelength, Therefore, tuning the grating spectrum by $\Delta P$ will shift the emitted wavelength by $P_1$. This method has been successfully applied in fabricating the tunable lasers with ultra wide range of wavelength.

The embodiment of the present invention is applied in making SGDBR laser arrays where every laser in the array have the same $\Delta P$ but different $P_1$. The difference in $P_1$ is carried out by mask design. All lasers have the same Bragg wavelength since all the gratings are formed under the same holographic exposure. In the situation that the mirror is not tuned, all lasers will emit at the same wavelength; While the output wavelength of each laser will shift $P_1$ when it is tuned by the same $\Delta P$. Since each laser has a different $P_1$, all the lasers will have different output wavelengths. The tuning of laser wavelength can also be achieved by tuning the other grating mirror, or by shifting to the other peaks.

Figure 6:
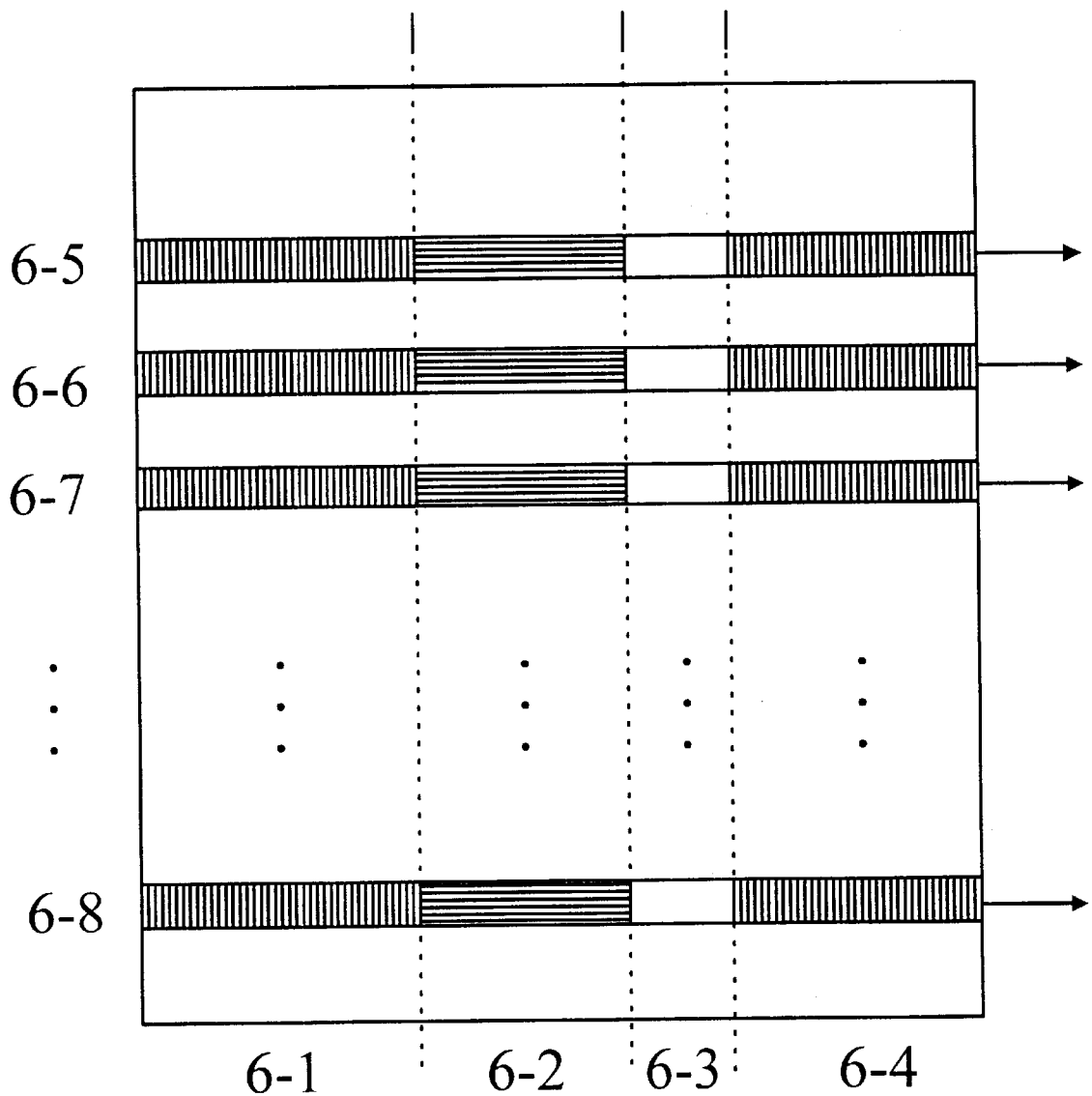
Figure 7:
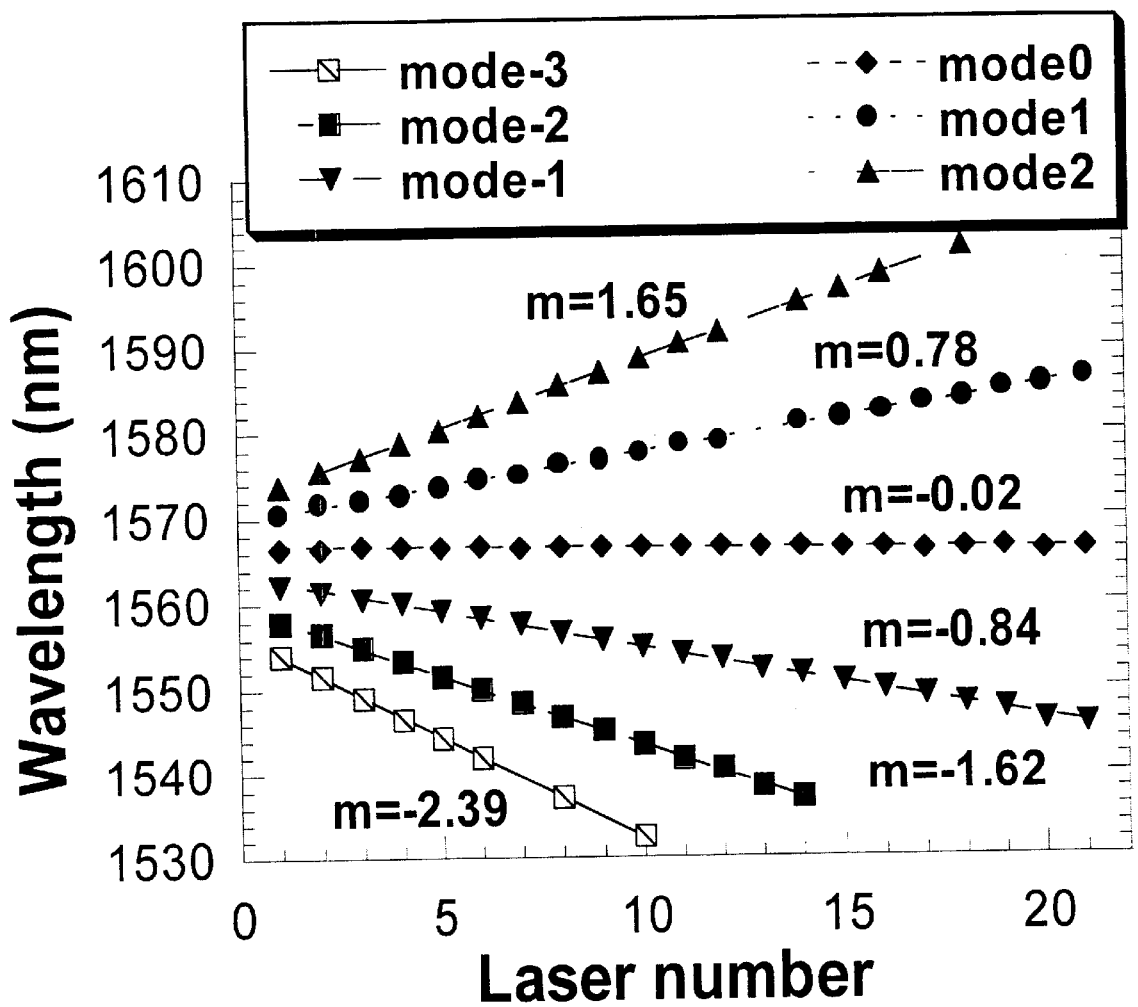

Table 1 shows the mirror parameters for fabricating 1.55 $\mu$m laser arrays by using SGDBR lasers. The laser array was fabricated on InGaAsP/InP material, and six compressively strained quantum wells were used in the gain section to provide gain. FIG. 6 shows the top view of the structure of a SGDBR laser array. FIG. 7 summaries the output wavelengths of this laser array under different amount of tuning. It can be clearly seen from the figure that all the 21 lasers in a laser array can emit laser light, and their output wavelengths can easily be tuned to have 0.8 nm wavelength spacing. The side mode suppression ratios for all the lasing wavelengths are larger than 30 dB. Therefore, high performance multi-wavelength laser arrays can be fabricated by the method of the present invention.

The arrangement of the output wavelengths of SGDBR laser arrays mentioned above can be classified into 5 ways:

(1) All the lasers have the same Bragg wavelength and no tuning current is applied to the sampled grating mirrors. In this way, all the lasers in the array emit light at the same wavelength.

(2) All the lasers have the same Bragg wavelength and equal amount of tuning current is applied to one of their grating mirrors such that all the lasers emit light at their first-order peak. Since the wavelength difference between the first-order peaks of adjacent lasers is designed to be $\Delta\lambda$, the laser array outputs multiwavelength light with a wavelength spacing of $\Delta\lambda$.

(3) Same as (2), but a larger tuning current is applied such that the lasers emit light at higher-order peaks. Supposed that the two grating mirrors align at the n-th order peaks, the wavelength spacing of the multiwavelength output light will be n $\Delta\lambda$.

Figure 8:
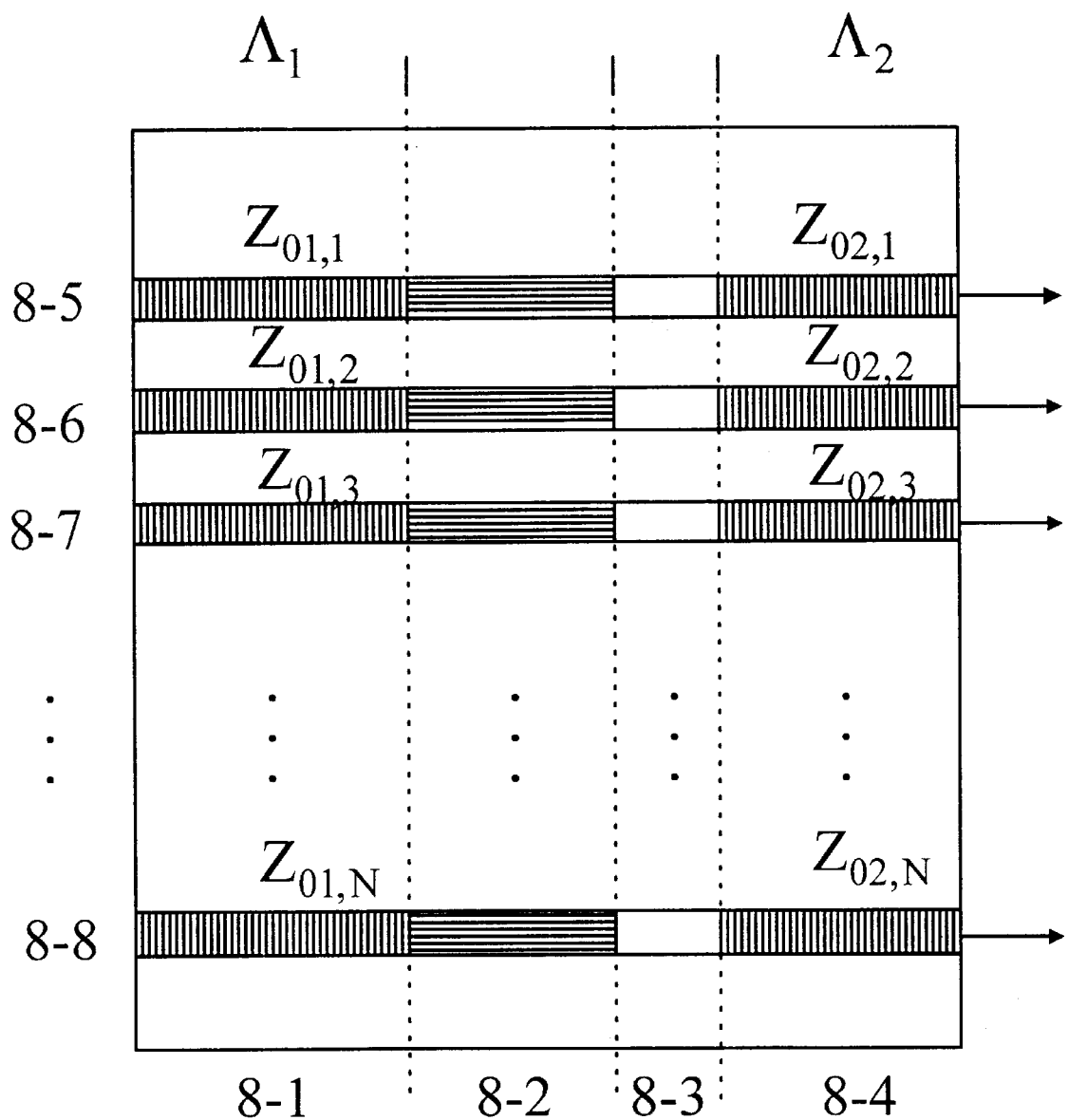
FIG. 8 shows the laser array design by using two holographic exposures

(4) The Bragg wavelengths of the two grating mirrors of each laser in the array differ each other by $\Delta P$ (refer to FIG. 4). The difference in the Bragg wavelength can be achieved by two grating exposure. In this way, all the lasers emit light at their first-order peaks without any tuning to the mirrors, so multiwavelength output with a wavelength of $\Delta\lambda$ can be obtained without tuning. FIG. 8 shows the laser array design by using two holographic exposures. This method differs from the current method of fabricating laser array by using multiple holographic exposure. It is necessary for each laser of the laser array to have a different grating period in the prior method, but in the method of the present invention the two mirrors of each laser have different grating periods and all lasers have the same grating period. Therefore no matter how many lasers there are, only two holographic exposures are needed. FIG. 8 shows the laser array design by using two holographic exposures.

Figure 9:
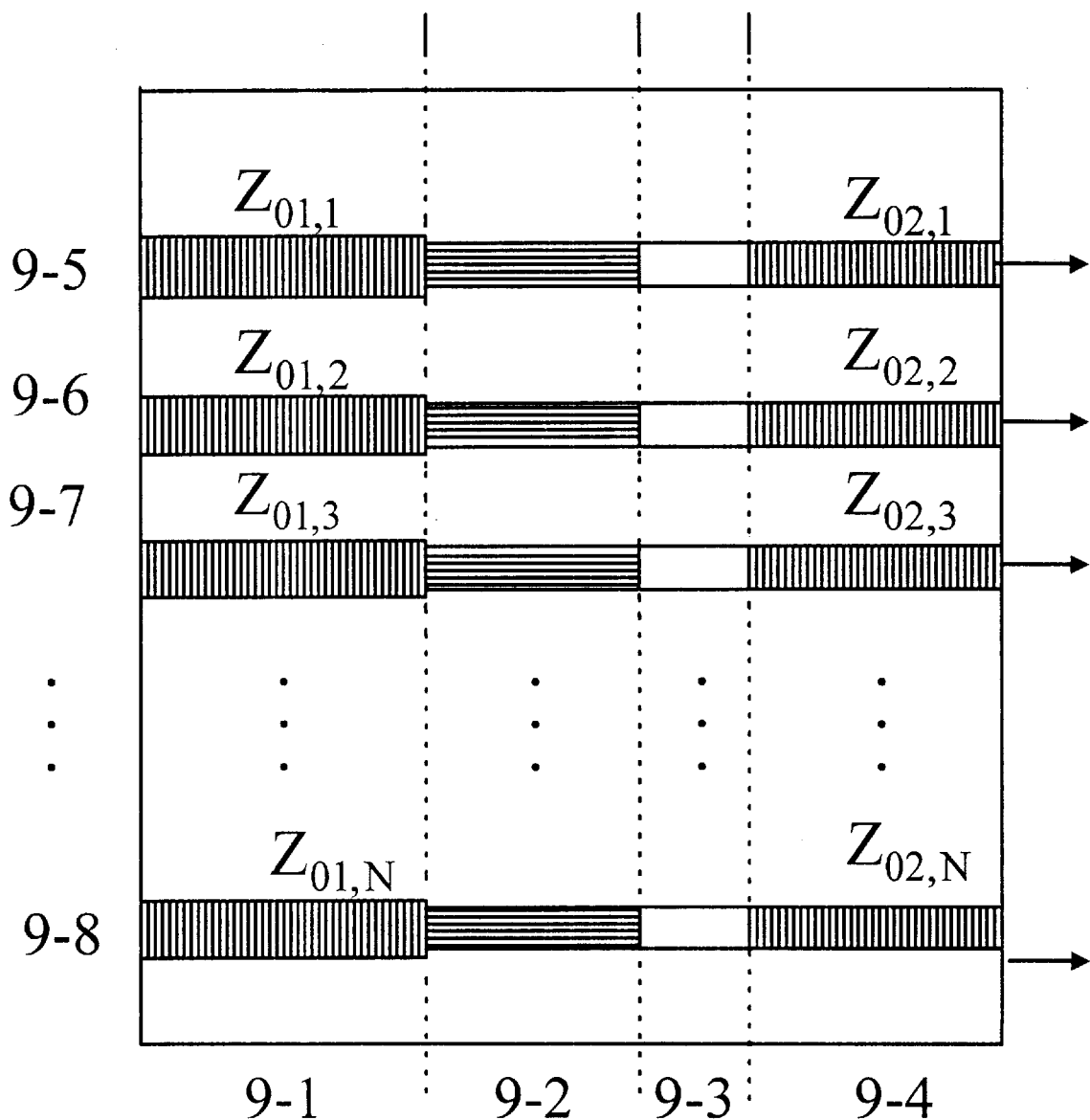
FIG. 9 shows the design of laser array which varies the waveguide width.

(5) Same as (4), but different in the Bragg wavelength is achieved by using different thickness or width for the two grating mirrors of each laser. A multiwavelength laser array with a wavelength spacing of $\Delta\lambda$ can be formed without tuning. This method differs from the method which varies the thickness or width of the waveguide to fabricate laser array. The waveguides of each laser in the laser array of the prior method must have different thicknesses or widths; while the waveguides on the two mirrors of each laser in the laser array of the method of the present invention have different thicknesses or widths, and the waveguide structures of all lasers are the same. Therefore no matter how many lasers there are in the laser array, one only needs to design two waveguide thicknesses or widths. FIG. 9 shows the design of laser array which varies the waveguide width.

The variation in device structure after laser array fabrication will result in the error on the absolute wavelength of each laser and on the wavelength spacing among the lasers. The lasers in the proposed laser array can be individually adjusted the wavelength by tuning the phase control section or by tuning both grating mirrors together. This can correct the wavelength errors resulting from the variation in device fabrication.

Special Features and Functions (1) simple process: multiwavelength laser arrays can be fabricated with single holographic exposure without the necessity of complicated etching procedures or selective epitaxy technology.

(2) The wavelength of each laser can be tuned to an accurate position.

(3) The wavelength spacing of neighboring lasers can be set accurately during the design of photo mask for the laser array, and also can be tuned by using the wavelength tuning mechanism of each laser.

(4) There can be various set of output wavelengths for a laser array (e.g. can form multi-wavelength light output with different wavelength spacings by using appropriate wavelength tuning mechanism).

(5) Since the process is simple, the cost of fabricating laser array can be reduced and the reliability can be improved.

(6) The laser arrays can be applied in Dense WDM systems as multi-wavelength light sources, or as tunable laser arrays.

The present invention provides the tunable laser arrays for high capacity optical networks in which the multi-wavelength laser source is one of the key components. The wavelength accuracy of each laser, and the cost of laser arrays determine the feasibility of multi-wavelength laser sources in optical networks. That is the performance and price of multi-wavelength sources play the key role in the development of high capacity optical networks. The patent of the present invention provides a simple and accurate method for fabricating multi-wavelength laser array of which the wavelength and wavelength spacing can be precisely set or fabricating discrete lasers that have different wavelengths from dicing the laser array into discrete devices.

TABLE 1

| number | $P_1$(nm) | $Z_{01}(\mu m)$ | $P_2$(nm) | $Z_{02}(\mu m)$ |
|---|---|---|---|---|
| 1 | 3.4 | 95.75 | 4.2 | 77.5 |
| 2 | 4.2 | 77.5 | 5 | 65.25 |
| 3 | 5 | 65.25 | 5.8 | 56.25 |
| 4 | 5.8 | 56.25 | 6.6 | 49.25 |
| 5 | 6.6 | 49.25 | 7.4 | 44 |
| 6 | 7.4 | 44 | 8.2 | 39.75 |
| 7 | 8.2 | 39.75 | 9 | 36.25 |
| 8 | 9 | 36.25 | 9.8 | 33.25 |
| 9 | 9.8 | 33.25 | 10.6 | 30.75 |
| 10 | 10.6 | 30.75 | 11.4 | 28.5 |
| 11 | 11.4 | 28.5 | 12.2 | 26.75 |
| 12 | 12.2 | 26.75 | 13 | 25 |
| 13 | 13 | 25 | 13.8 | 23.5 |
| 14 | 13.8 | 23.5 | 14.6 | 22.25 |
| 15 | 14.6 | 22.25 | 15.4 | 21.25 |
| 16 | 15.4 | 21.25 | 16.2 | 20 |
| 17 | 16.2 | 20 | 17 | 19.25 |
| 18 | 17 | 19.25 | 17.8 | 18.25 |
| 19 | 17.8 | 18.25 | 18.6 | 17.5 |
| 20 | 18.6 | 17.5 | 19.4 | 16.75 |
| 21 | 19.4 | 16.75 | 20.2 | 16 |

What is claimed is:

1. A method of fabricating a multi-wavelength laser array having a plurality of lasers, said method comprising the steps of:

using two mirrors with a plurality of reflection peaks in each mirror reflection spectrum and a gain region;

forming a longitudinal structure of each laser having a control section;

providing each laser in the array with the same center positions of reflection spectra ($\lambda_B$) of two mirrors in each laser of said plurality of lasers;

using a same difference between a peak spacing in the mirror reflection spectra of the two mirrors ($\Delta P$) for all the lasers;

varying the peak spacing of the mirror reflection spectra over the plurality of lasers in the array in the steps designing a photomask for photolithography of mirrors having said plurality of reflection peaks; and fixing the difference in the peak spacing between any two neighboring lasers in the same step of designing photomask.

2. A method of fabricating a multi-wavelength laser array having a plurality of lasers, said method comprising the steps of:

using two mirrors with a plurality of reflection peaks in each mirror reflection spectrum and a gain region;

forming a longitudinal structure of each laser with phase control section of said plurality of lasers;

providing said each laser in the array with the reflection spectra ($\lambda_B$) of two mirrors in said each laser being aligned at any two of the plurality of reflection peaks other than center peaks;

using the same difference between a peak spacing in the mirror reflection spectra of the two mirrors ($\Delta P$);

varying the peak spacing of the mirror reflection spectra over the plurality of lasers in the multi-wavelength laser array in the steps of designing the photomask for photolithography of mirrors having said plurality of reflection peaks;

fixing the difference in the peak spacing between any two neighboring lasers; and achieving misalignment at the center of the mirror reflection spectra of the two mirrors by a specific processing technology like an additional etching step or an additional holographical exposure that shifts a center wavelength of one of the mirrors by an integral number of peak spacing difference ($\Delta P$).

3. The method of fabricating multi-wavelength laser arrays according of claim 1, further comprises the step of:

fabricating discrete lasers that have different wavelengths from dicing the laser array into discrete devices.

4. The method of fabricating multi-wavelength laser arrays according of claim 2, further comprises the step of:

fabricating discrete lasers that have different wavelengths from dicing the laser array into discrete devices.

* * * * *